United States Patent [19]

Greeson et al.

[11] Patent Number: 5,343,363
[45] Date of Patent: Aug. 30, 1994

[54] SPLIT BACKED PRESSURE SENSITIVE DIE CARRIER TAPE

[75] Inventors: Michael R. Greeson, Kokomo, Ind.;
James C. Baar, Logansport, Mich.;
Jerry D. Haines, Greentown; James
J. Tepe, Kokomo, both of Ind.

[73] Assignee: Delco Electronics Corporation, Kokomo, Ind.

[21] Appl. No.: 993,567

[22] Filed: Dec. 21, 1992

[51] Int. Cl.⁵ .............................. H05K 1/00
[52] U.S. Cl. .................... 361/749; 361/761; 361/785; 361/796; 174/259; 439/77
[58] Field of Search ............. 361/393, 395, 398, 401, 361/413, 415, 729, 748, 749, 761, 785, 796; 206/328, 330–332, 340; 439/67, 77, 485; 174/17 R, 255, 259; 257/782, 783, 784, 786

[56] References Cited

U.S. PATENT DOCUMENTS

| | | | |
|---|---|---|---|
| 3,766,439 | 10/1973 | Isaacson | 317/100 |
| 4,330,790 | 5/1982 | Burns | 357/70 |
| 4,562,924 | 1/1986 | Okamoto | 206/330 |
| 4,617,605 | 10/1986 | Obrecht et al. | 361/220 |
| 4,928,206 | 5/1990 | Porter et al. | 361/385 |

Primary Examiner—Leo P. Picard
Assistant Examiner—Young Whang
Attorney, Agent, or Firm—Cary W. Brooks; Mark A. Navarre

[57] ABSTRACT

Disclosed is a split backed pressure sensitive die carrier tape including a flexible carrier member having a plurality of holes formed therein of a size larger than a die to be carried. Two strips of pressure sensitive adhesive tape are placed along the back face of the carrier partially covering each hole in the carrier. The two strips of substantially straight pressure sensitive tape are spaced apart so that a poke up needle can be passed between the pressure sensitive tape and through the hole formed in the carrier without tearing or damaging either strip of pressure sensitive tape. An integrated circuit chip is positioned in the hole in the carrier and secured to the pressure sensitive tapes.

4 Claims, 2 Drawing Sheets

SPLIT BACKED PRESSURE SENSITIVE DIE CARRIER TAPE

FIELD OF THE INVENTION

This invention relates to a split backed pressure sensitive die carrier tape for holding various surface mount components including, but not limited to, integrated circuits, chip capacitors, mechanical bonding pads, chip resistors, and small outline transistors.

Background

There is a variety of device or die carrier tapes known to those skilled in the art. FIG. 1 illustrates one type of die carrier tape 10 known as "embossed with cover". This system includes a flexible plastic carrier 12 having a pocket 14 formed therein for receiving an integrated circuit chip 16. A hole 18 is formed in the bottom of the pocket to allow a poke up needle to pass through and push the integrated circuit chip out of the pocket of the carrier. The system includes a cover 20 over the pocket to keep the integrated circuit chip in place during storage. However, as the cover is removed, the die often pops out before being properly grasped by handling equipment. Further, the cover makes it difficult to visualize the die at high magnification in quality control operations. Still further, the embossed tape has a pocket which can accommodate only one type size of die.

FIG. 2 illustrates another die carrier tape 22 known as "punched with pressure sensitive adhesive backing". The carrier includes a flexible plastic strip 24 having a plurality of holes 26 formed therein larger than the die 28 to be carried. A pressure sensitive adhesive tape 30 is placed on the back side of the flexible carrier so as to completely cover the holes formed in the carrier. The die is placed in the hole formed in the carrier and held in position by the pressure sensitive adhesive tape. To remove the die, a poke up needle is pushed through the pressure sensitive tape so that the die is no longer adhered to the tape. A vacuum pick up tip is used to grasp the die in the elevated position. However, sometimes a small portion of the pressure sensitive adhesive tape 30 is removed as the poke up needle is extended through the tape and the tape becomes stuck to the back side of the chip 28. This small piece of tape causes problems when the chip is subsequently soldered to a substrate.

FIG. 3 illustrates another die carrier 32 which is known as "punched with cover". The carrier includes a flexible plastic strip 34 having a plurality of holes 36 formed therein for receiving an integrated circuit chip 38. A heat sealable transparent cover 40 is placed on the back side of the tape and the chip placed inside of the hole in the carrier. A heat sealable transparent top cover 42 is also placed on the top side of the flexible carrier to seal the integrated circuit chip in position. When the top cover 42 is removed, chips often pop out and are damaged. This system is also disadvantageous in that small pieces of the back side cover 40 sometimes become stuck to the underside of the chip. This causes problems when the chip is soldered to a substrate.

Thus, it would be desirable to have a carrier tape system which overcomes the disadvantages of the prior art.

SUMMARY OF THE INVENTION

The invention includes a split backed pressure sensitive die carrier tape including a flexible carrier member having a plurality of die holes formed therein of a size larger than a device or die to be carried. Two strips of pressure sensitive adhesive tape are placed along the back face of the carrier partially covering each die hole in the carrier. However, the two strips of substantially straight pressure sensitive tape are spaced apart so that a poke up needle can be passed between the pressure sensitive tape and through the hole formed in the carrier without tearing or damaging either strip of pressure sensitive tape. An integrated circuit chip is positioned in the hole in the carrier and secured to the pressure sensitive tapes.

These and other objects, features and advantages of the present invention will become apparent from the following brief description of the drawings, detailed description, and appended claims and drawings.

DETAILED DESCRIPTION

Figure 1:
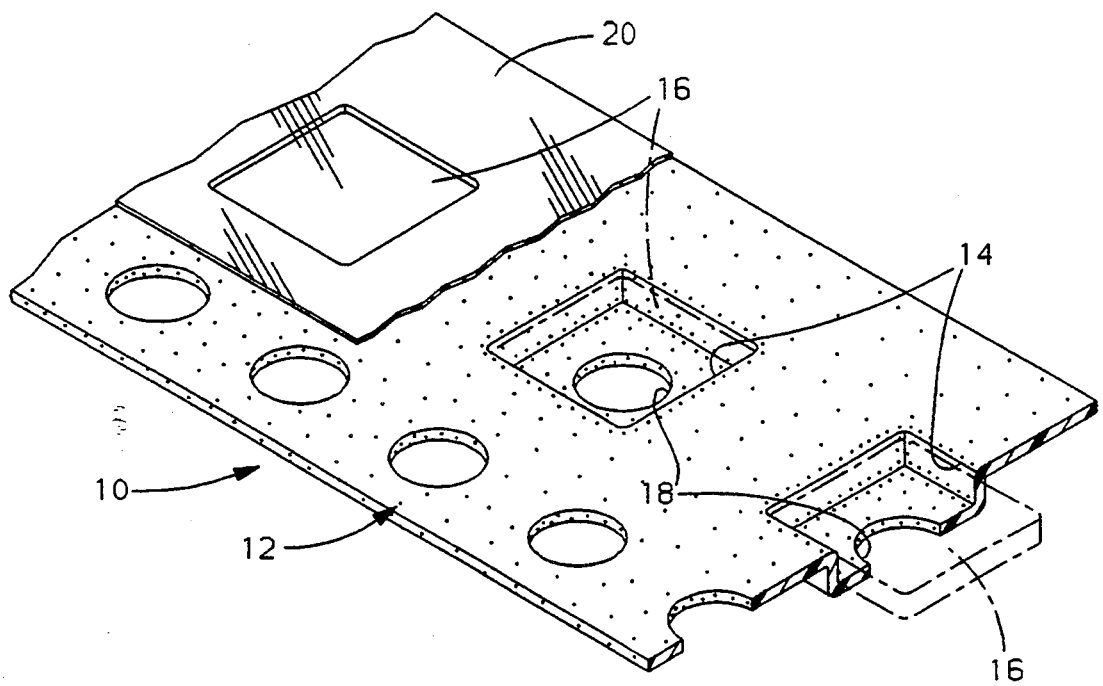
FIG. 1 illustrates a prior art tape carrier system known as "embossed with cover"
Figure 2:
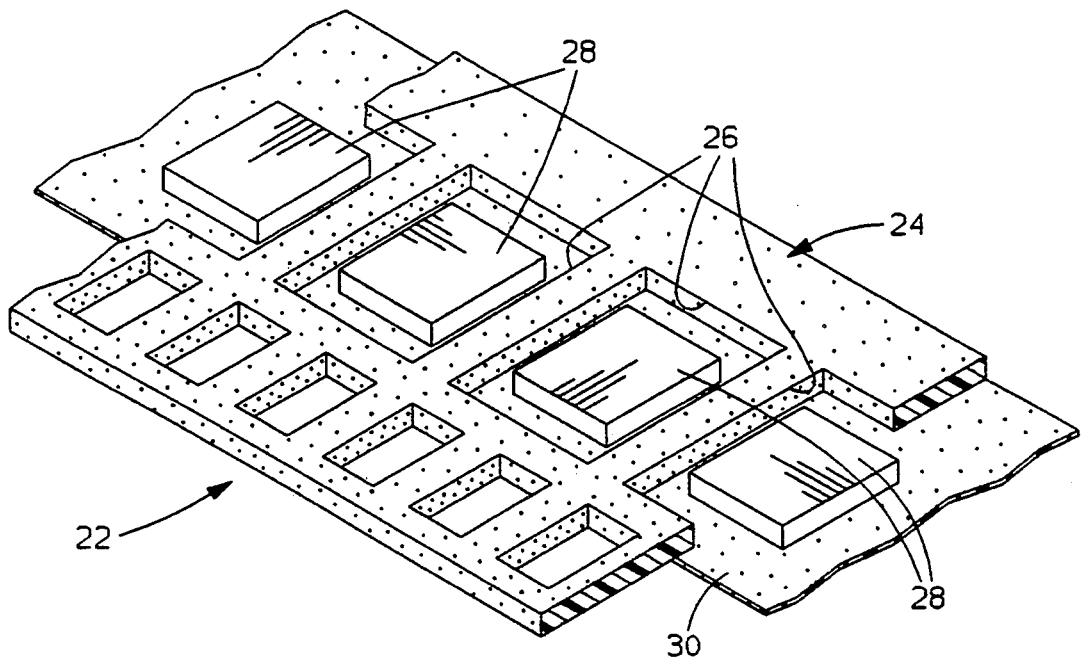
FIG. 2 illustrates a prior art carrier tape system known as "punched with pressure sensitive adhesive backing"
Figure 3:
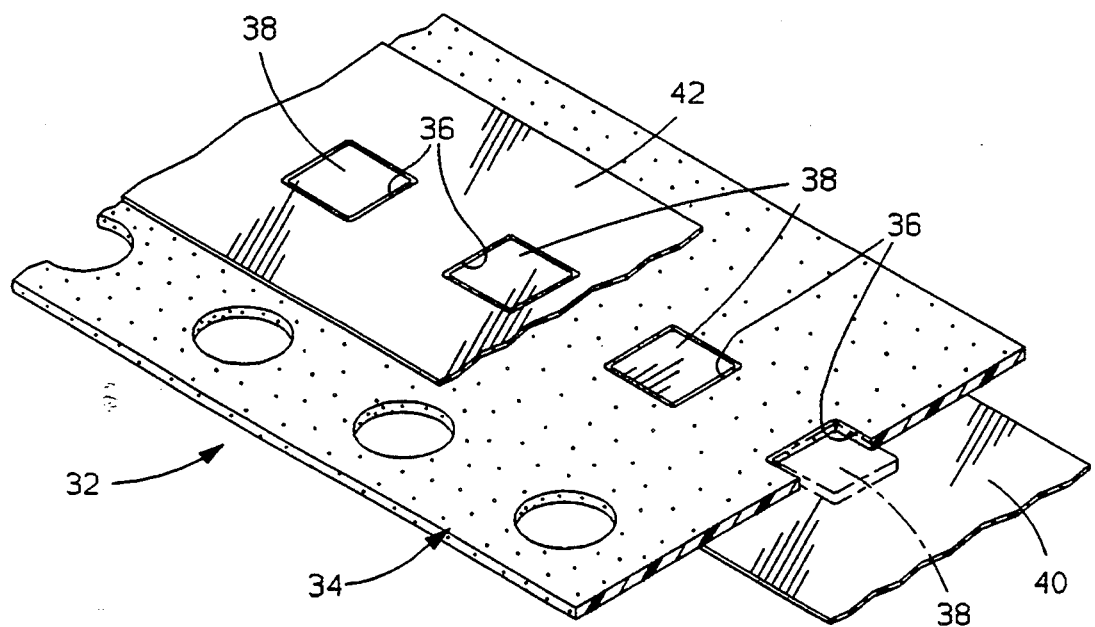
FIG. 3 illustrates a prior art carrier tape system known as "punched with cover"
Figure 4:
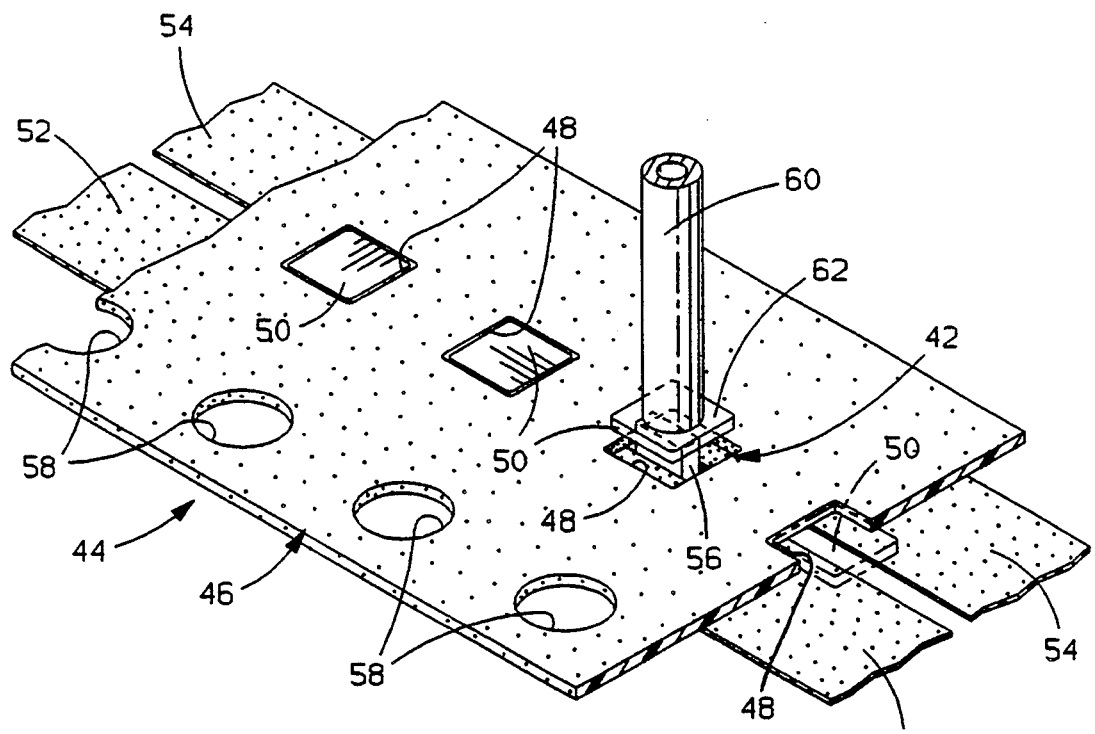
FIG. 4 illustrates a carrier tape system according to the present invention.

FIG. 4 illustrates a carrier tape system 44 according to the present invention. The system includes a carrier 46 which is preferably made out of a flexible material such as plastic. A plurality of die holes 48 are formed in the carrier, each having a size greater than a device or die 50, i.e., integrated circuit chips, to be received therein. Two strips 52, 54 of pressure sensitive adhesive tape are placed on the back face of the carrier so as to cover a portion of each die hole 48 in the carrier. However, the substantially straight pressure sensitive adhesive strips are spaced apart a distance sufficient for a poke up needle 56 to extend upwardly between the strips of tape and through the hole formed in the carrier to remove the die from the carrier.

A device such as an integrated circuit chip is placed in each die hole in the carrier so that it is secured to each pressure sensitive strip. The carrier with integrated circuit chips thereon may be stored on a reel in a manner known to those skilled in the art. Preferably, each piece of pressure sensitive adhesive tape has adhesive only on the one side which contacts the back face of the carrier.

When the carrier is placed on a reel, a leading edge of the carrier may be unwound from the reel. The carrier may also have a second set of holes 58 for receiving portions of a sprocket for winding and unwinding the carrier. When the leading edge of the carrier is properly positioned, a poke up needle 56 is extended upwardly through the space provided by the two pressure sensitive adhesive strips 52, 54 engaging the integrated circuit chip 50 and moving the integrated circuit chip out of contact with the pressure sensitive adhesive strips. Simultaneously, a vacuum pick-up tip 60 engages the top face 62 of the integrated circuit chip and removes the chip for further processing such as soldering to a substrate. There is no need to remove the pressure sensitive adhesive strips from the carrier in order to remove the die.

The embodiments of the invention in which an exclusive property or privilege is claimed are defined as follows:

1. A die carrier tape system comprising:

a flexible carrier having a top surface and a bottom surface and a plurality of holes formed in the carrier extending between the top surface and the bottom surface; and a pair of parallel pressure sensitive adhesive strips for retaining die in said holes, each having an adhesive surface adhered to a back surface of the carrier and covering a portion of each of said holes formed in the carrier, and said strips being spaced apart a distance which allows a poke up needle to pass between the strips and directly contact the die to facilitate die removal.

2. A combination comprising:

a die carrier tape system comprising a flexible carrier having a top face and a bottom face and a plurality of holes extending between said faces of a size greater than a die to be carried by the system; and a pair of parallel pressure sensitive adhesive strips adhered to a back face of the carrier and each covering a portion of said holes, and spaced apart a distance which allows a poke up needle to pass through the space provided between said strips; and a die received in a hole in said carrier and adhered to each pressure sensitive strip, thereby allowing the poke up needle to directly contact the die to facilitate die removal.

3. A combination as set forth in claim 2 wherein said die comprises an integrated circuit chip.

4. A method comprising:

removing a die from a carrier system including a flexible carrier having a top face and a bottom face and a plurality of holes extending between said faces of a size greater than a die to be carried, and a pair of parallel pressure sensitive adhesive strips adhered to the back face of the carrier covering a portion of said holes and spaced apart a distance which allows a poke up needle to pass between said strips, by extending a poke up needle through the space provided by said strips to directly engage said die and remove it from contact with said strips, and grasping the top face of the die with a vacuum pick up tube to remove said die from said carrier system.

* * * * *